(12) United States Patent
Hatanaka et al.

(10) Patent No.: US 7,808,796 B2
(45) Date of Patent: Oct. 5, 2010

(54) ELECTRONIC COMPONENT MODULE AND METHOD FOR MANUFACTURING THE SAME

(75) Inventors: Hidefumi Hatanaka, Kirishima (JP); Tsutomu Adachi, Kirishima (JP); Youichi Yokote, Kirishima (JP); Miho Imashioya, Kirishima (JP); Tomohiko Taniguchi, Higashiomi (JP)

(73) Assignees: Kyocera Corporation, Kyoto (JP); Kyocera Kinseki Corporation, Tokyo (JP)

( * ) Notice: Subject to any disclaimer, the term of this patent is extended or adjusted under 35 U.S.C. 154(b) by 0 days.

(21) Appl. No.: 11/852,888

(22) Filed: Sep. 10, 2007

(65) Prior Publication Data

US 2008/0192443 A1    Aug. 14, 2008

Related U.S. Application Data

(63) Continuation of application No. PCT/JP2006/304736, filed on Mar. 10, 2006.

(30) Foreign Application Priority Data

Mar. 10, 2005   (JP)   ............................... 2005-067714

(51) Int. Cl.
*H05K 7/00*   (2006.01)
(52) U.S. Cl. ....................................... 361/760; 361/719
(58) Field of Classification Search ................. 361/719, 361/766, 761, 764, 780; 257/679, 691, 698; 438/119, 118, 106
See application file for complete search history.

(56) References Cited

U.S. PATENT DOCUMENTS

| | | | | |
|---|---|---|---|---|
| 5,455,383 A | * | 10/1995 | Tanaka | 174/36 |
| 5,625,536 A | * | 4/1997 | Soyano et al. | 361/736 |
| 6,356,453 B1 | * | 3/2002 | Juskey et al. | 361/760 |
| 6,445,591 B1 | * | 9/2002 | Kwong | 361/761 |
| 6,890,798 B2 | * | 5/2005 | McMahon | 438/122 |
| 6,974,724 B2 | * | 12/2005 | Hyvonen et al. | 438/107 |
| 7,102,220 B2 | * | 9/2006 | Stevens et al. | 257/686 |
| 7,359,213 B2 | * | 4/2008 | Vasudivan et al. | 361/763 |
| 2002/0140085 A1 | * | 10/2002 | Lee et al. | 257/724 |

FOREIGN PATENT DOCUMENTS

| | | |
|---|---|---|
| JP | 06-291246 | 10/1994 |
| JP | 07-042165 | 7/1995 |
| JP | 10-326846 | 12/1998 |
| JP | 2001-068799 | 3/2001 |
| JP | 2003-204013 | 7/2003 |

* cited by examiner

*Primary Examiner*—Jinhee J Lee
*Assistant Examiner*—Yuriy Semenenko
(74) *Attorney, Agent, or Firm*—Hogan Lovells US LLP

(57) ABSTRACT

An electronic component module comprises a circuit board having a cavity in one principal surface thereof. The electronic component module also comprises a first semiconductor device accommodated within the cavity and a second semiconductor device disposed on the one principal surface of the circuit board so as to cover the first semiconductor device in plan view. The electronic component module further comprises a resin material disposed to cover at least a side surface of the second semiconductor device.

30 Claims, 5 Drawing Sheets

FIG. 4 (A-A)
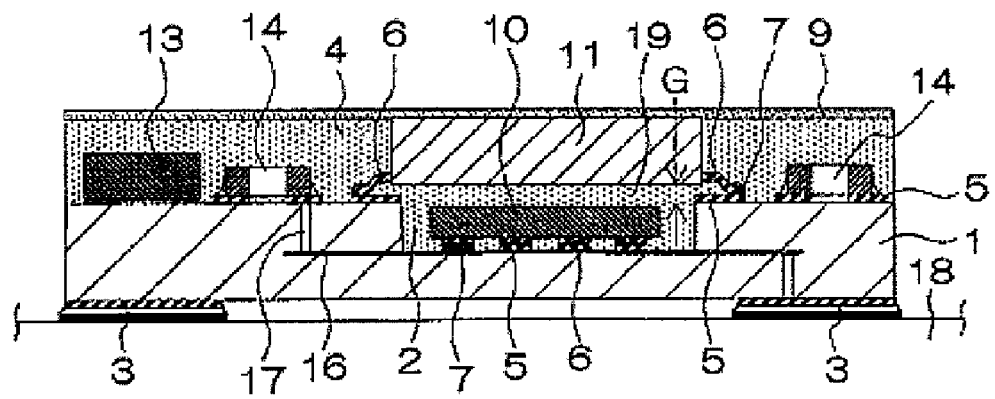
FIG. 5 (B-B)
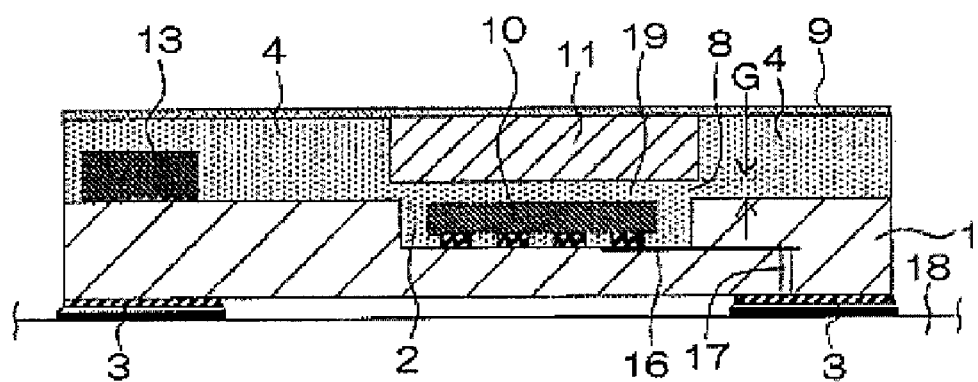
FIG. 6
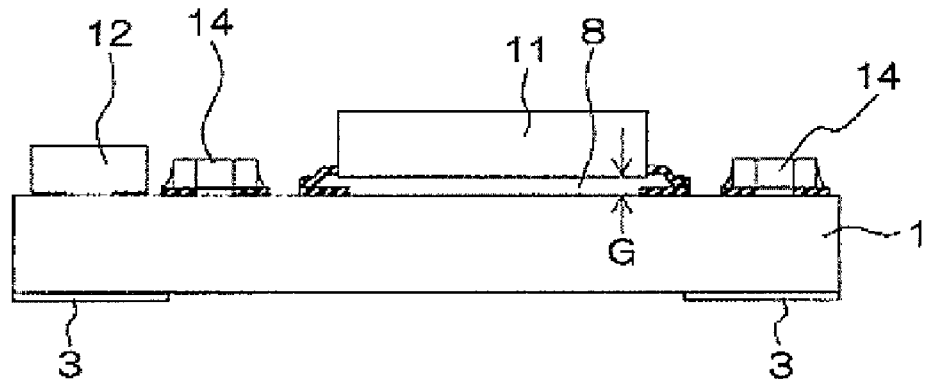

ELECTRONIC COMPONENT MODULE AND METHOD FOR MANUFACTURING THE SAME

CROSS-REFERENCE TO RELATED APPLICATIONS

The present application claims priority under 35 U.S.C. §120 to PCT Application No. PCT/JP2006/304736, filed on Mar. 10, 2006, entitled "ELECTRONIC COMPONENT MODULE AND METHOD FOR MANUFACTURING SAME." The contents of this application are incorporated herein by reference in their entirety.

BACKGROUND OF THE INVENTION

1. Field of Invention

The present invention relates to an electronic component module having electronic component devices mounted on a circuit board. An electronic component module is applicable to electronic apparatuses of various purposes, such as a GPS (global positioning system) module, a W-LAN (wireless LAN) module, a tuner module, and a clock module.

2. Related Art

In recent years, electronic component modules that have a plurality of electronic component devices, such as semiconductor devices, mounted on circuit boards are rapidly becoming common.

FIG. 14 shows a known example of an electronic component module that includes a first semiconductor device 10 (such as a control IC), a second semiconductor device 11 (such as an RF (radio frequency) IC), and a plurality of passive components 13 and 14. The semiconductor devices 10 and 11 and the passive components 13 and 14 are arranged side-by-side on a circuit board 1a, and are covered with a metallic shield casing 15.

Japanese Unexamined Patent Application Publication No. 2003-204013 is published as a related art. The contents of this publication are incorporated by reference in their entity.

However, in the electronic component module of the known art, since the first and second semiconductor devices 10 and 11 are arranged side-by-side on the circuit board 1a, the circuit board 1a requires a space for mounting the first and second semiconductor devices 10 and 11. This causes the circuit board 1a to be large in size, thus unfavorably leading to size increase in the entire structure of the electronic component module.

In addition, in the case where the electronic component module is provided with the shield casing 15, the assembly process of the electronic component module becomes complicated since positioning and soldering between the shield casing 15 and the circuit board 1a, for example, are necessary. Moreover, if the electronic component module is to be manufactured by a technique in which multiple electronic component modules are to be obtained from a large board having a plurality of circuit board areas, the shield casing as described above must be attached to each one of the circuit boards. This significantly lowers the productivity.

An object of the present invention is to provide an electronic component module that is compact and allows for high productivity, and a method for manufacturing the same.

SUMMARY OF THE INVENTION

According to one aspect of the invention, an electronic component module comprises a circuit board having a cavity in one principal surface thereof. The electronic component module also comprises a first semiconductor device accommodated within the cavity and a second semiconductor device disposed on the one principal surface of the circuit board so as to cover the first semiconductor device in plan view. The electronic component module further comprises a resin material disposed to cover at least a side surface of the second semiconductor device.

According to another aspect of the invention, a first method for manufacturing an electronic component module comprises preparing a master board having a plurality of circuit board areas. Each of the circuit board areas has a cavity in an upper surface thereof. The first method further comprises placing first semiconductor devices within the cavities and disposing second semiconductor devices on the circuit board areas. Each of the second semiconductor devices is disposed so as to cover the corresponding first semiconductor device and an opening area of the corresponding cavity and so as to have a gap to keep a predetermined distance between a lower surface of the second semiconductor device and the upper surface of the corresponding circuit board area. The first method further comprises applying a resin paste onto an upper surface of the master board to cover both the first semiconductor devices and the second semiconductor devices with the resin paste. The first method further comprises cutting the master board along the circuit board areas to divide the master board into a plurality of separate pieces.

According to another aspect invention, a second method for manufacturing an electronic component module comprises preparing a master board having a plurality of circuit board areas. Each of the circuit board areas has a cavity in an upper surface thereof. The second method further comprises placing first semiconductor devices within the cavities and disposing second semiconductor devices on the upper surfaces of the circuit board areas. Each of the second semiconductor devices is disposed so as to cover the corresponding first semiconductor device and so as to expose at least a part of an opening area of the corresponding cavity. The second method further comprises applying a resin paste onto an upper surface of the master board to cover both the corresponding first semiconductor device and the corresponding second semiconductor device with the resin paste. The second method further comprises cutting the master board along the circuit board areas to divide the master board into a plurality of separate pieces.

The above features and other features, characteristics, and advantages of the present invention will become more apparent from the following description of embodiments with reference to the attached drawings.

BRIEF DESCRIPTION OF THE DRAWINGS

FIG. 4 is a cross-sectional view taken along line A-A and illustrates a state where the electronic component module is filled with a resin material.

FIG. 5 is a cross-sectional view taken along line B-B and illustrates a state where the electronic component module is filled with the resin material.

FIG. 6 is a side view of the electronic component module, as viewed from a direction indicated by reference character C.

DETAILED DESCRIPTION OF THE PREFERRED EMBODIMENTS

An electronic component module according to an embodiment of the present invention will be described in detail below with reference to the drawings.

The first embodiment will be described with a communication high-frequency module as an example, which includes an RFIC and a control IC respectively as first and second semiconductor devices.

Figure 1:
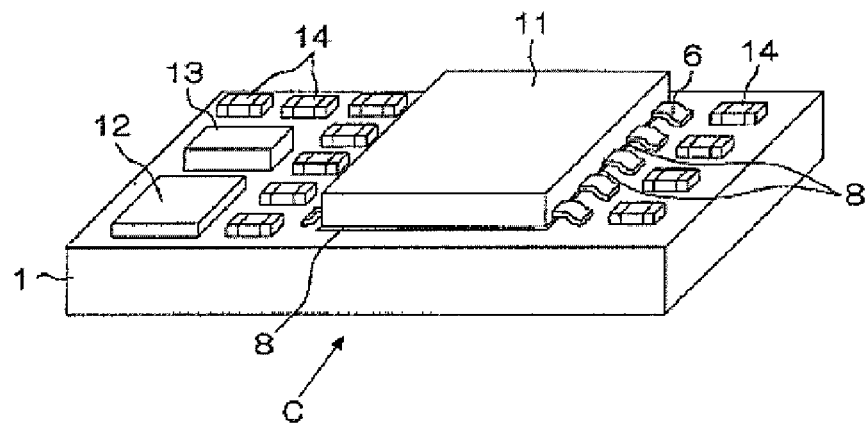
FIG. 1 is an external perspective view of an electronic component module according to the first embodiment of the present invention, with a resin material omitted therefrom.
Figure 2:
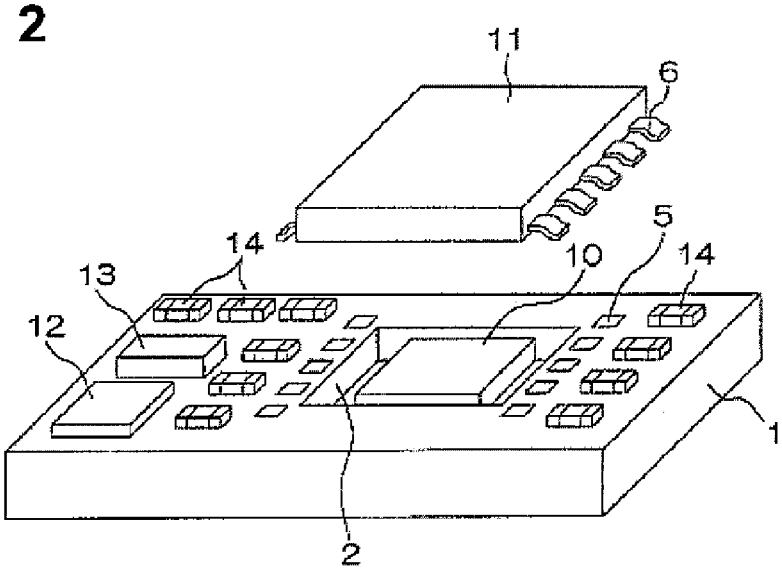
FIG. 2 is an exploded perspective view of the electronic component module.

FIG. 1 is a perspective view of the electronic component module (with a resin material omitted therefrom) according to an embodiment of the present invention. FIG. 2 is an exploded perspective view of the electronic component module illustrated in FIG. 1.

Figure 3:
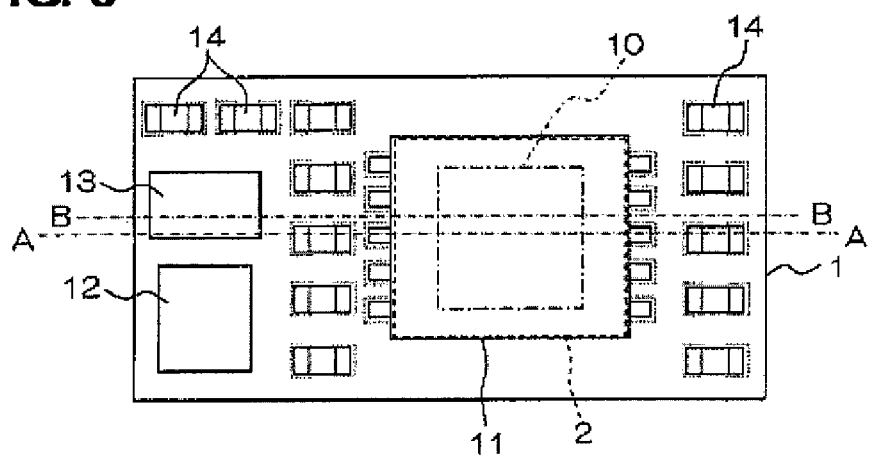
FIG. 3 is a plan view of the electronic component module.

FIG. 3 is a top view of the electronic component module. FIG. 4 is a cross-sectional view of the electronic component module, taken along line A-A in FIG. 3. FIG. 5 is a cross-sectional view of the electronic component module, taken along line B-B in FIG. 3. FIG. 6 is a side view of the electronic component module, as viewed from a direction indicated by reference character C.

The electronic component module includes a circuit board 1 having a cavity 2, a first semiconductor device 10 and a second semiconductor device 11 mounted on the circuit board 1, and a resin material 4 covering the second semiconductor device 11.

The circuit board 1 has the shape of a substantially rectangular prism, and has the cavity 2 in one principal surface thereof (i.e. upper surface in the drawings). The circuit board 1 is formed by stacking a plurality of insulator layers one on top of another, which are composed of a ceramic material, such as a glass-ceramic material and an alumina ceramic material. Each of the insulator layers is given a thickness of, for example, 50 μm to 300 μm. Although the number of the stacked insulator layers may be any, the number is set to, for example, five to fifteen layers.

The circuit board 1 is fabricated in the following manner. First, ceramic green sheets are obtained by mixing an appropriate organic solvent with ceramic powder of, for example, a glass-ceramic material. A conductive paste, which is to become circuits and connection pads, is applied onto a surface of each ceramic green sheet by, for example, a commonly known screen-printing technique. The ceramic green sheets with the conductive paste thereon are stacked one on top of another and pressed. Finally, the ceramic green sheets are fired at high temperature.

As illustrated in FIGS. 4 and 5 in cross section, the circuit board 1 has an internal conductor 16 and a via-hole conductor 17 formed therein. The internal conductor 16 and the via-hole conductor 17 constitute a predetermined circuit.

The lower surface of the circuit board 1 is provided with external terminals 3, and is connected to a main board 18 through these external terminals 3. The upper surface of the circuit board 1 is provided with electrode pads 5 and a surface conductive pattern (not shown).

The internal conductor, the external terminals 3, and the electrode pads 5 are made of a material mainly composed of metal, such as Ag, Cu, W, and Mo, and are formed by, for example, applying a conductive paste containing Ag powder, borosilicate low-melting glass frit, an organic binder such as ethyl cellulose, and an organic solvent onto the ceramic green sheets corresponding to the insulator layers of the circuit board 1 by a commonly known screen-printing technique, and then performing a firing step.

The cavity 2 provided in the circuit board 1 is a recess having a rectangular opening and accommodates the first semiconductor device 10.

The depth from the plane of the opening to the bottom surface of the cavity 2 is set such that, for example, the upper surface of the first semiconductor device 10 to be accommodated therein is not located above the upper surface of the circuit board 1.

The first semiconductor device 10 accommodated in the cavity 2 has a first circuit of, for example, Al formed on a surface of a semiconductor device substrate composed of, for example, Si or GaAs. This first circuit constitutes an amplifier circuit and an oscillator circuit.

With the surface having the first circuit set as the lower surface, the first semiconductor device 10 is flip-chip mounted on the bottom surface of the cavity 2. In other words, connection terminals 6 provided on the lower surface and electrode pads 5 provided on the bottom surface of the cavity 2 are electrically and mechanically bonded to each other with a conductive bonding material 7 such as solder.

Similar to the first semiconductor device 10 described above, the second semiconductor device 11 has a second circuit of, for example, Al formed on a surface of a semiconductor device substrate composed of, for example, Si or GaAs. This second circuit constitutes, for example, a communication control circuit.

With the surface having the second circuit set as the lower surface, the second semiconductor device 11 is disposed such that connection terminals 6 provided on this lower surface and electrode pads 5 provided on the upper surface of the circuit board 1 are electrically and mechanically bonded to each other with the conductive bonding material 7 such as solder.

In this embodiment of the present invention, the second semiconductor device 11 is disposed on the upper surface of the circuit board 1 in a state such that the second semiconductor device 11 is directly disposed above the first semiconductor device 10 so as to cover the first semiconductor device 10 in plan view.

Comparing the planar dimensions of the first semiconductor device 10 with the planar dimensions of the second semiconductor device 11, the second semiconductor device has larger planar dimensions. Furthermore, the second semiconductor device 11 and the opening area of the cavity 2 have substantially the same planar dimensions.

In FIG. 3, the solid line indicates the position of the second semiconductor device 11, the dash line indicates the opening area of the cavity 2, and the dot-dash line indicates the position of the first semiconductor device 10.

Even when the planar dimensions of the second semiconductor device 11 and the planar dimensions of the opening area of the cavity 2 are substantially the same as in this manner, the use of outwardly extending lead-type connection terminals as the connection terminals 6 for the second semiconductor device 11 allows the second semiconductor device 11 to be disposed on the upper surface of the circuit board 1. The same applies to a case where the planar dimensions of the second semiconductor device 11 are slightly smaller than the planar dimensions of the cavity 2.

As described above, the first semiconductor device 10 is accommodated within the cavity 2 provided at the upper surface of the circuit board 1, and the second semiconductor device 11 is disposed above the upper surface of the circuit board 1 so as to overlie the first semiconductor device 10. Thus, a mount area for the second semiconductor device 11 on the upper surface of the circuit board 1 can be omitted, whereby the circuit board 1 can be made compact. This allows for size reduction in the entire structure of the electronic component module. In addition, because the first semiconductor device 10, the second semiconductor device 11, and various components 12, 13, and 14 can all be mounted on one principal surface, the production efficiency is remarkably high.

Especially in the case where an RFIC and a control IC are to be used as the first and second semiconductor devices, it is preferable that the RFIC be accommodated within the cavity 2 and that the control IC be disposed so as to overlie the RFIC.

This is due to the fact that, by placing an RFIC that is susceptible to noise, such as electromagnetic waves, within a cavity and having an upper surface thereof be covered with a control IC, an undesired external effect of electromagnetic waves on the RFIC can be suppressed.

Figure 7:
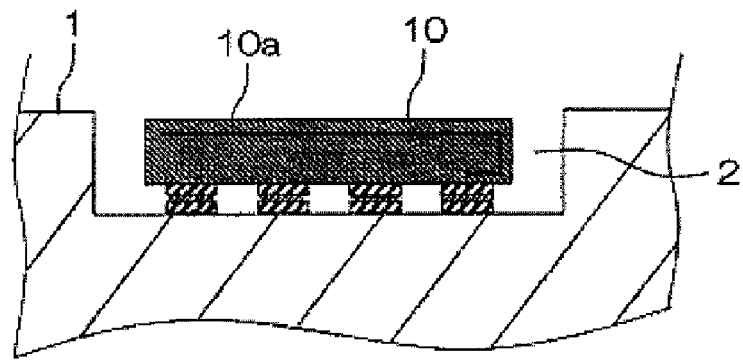
FIG. 7 is a cross-sectional view of a first semiconductor device.

Referring to FIG. 7, a conductive line of the first circuit formed on the lower surface of the first semiconductor device 10, which is maintained at a reference potential, is electrically connected to a conductive pattern 10a provided in the upper portion of the first semiconductor device 10. Specifically, the conductive line and the conductive pattern 10a are electrically connected to each other inside the semiconductor device substrate. Thus, the upper surface of the first semiconductor device 10 can be maintained at a reference potential. Consequently, electromagnetic interference between the first semiconductor device 10 and the second semiconductor device 11 can be suppressed more effectively.

In this case, the term "reference potential" refers to a potential that a conductor connected to ground has, and generally refers to a ground potential (a ground potential may be zero volts or may not be zero volts).

In addition to the second semiconductor device 11, the upper surface of the circuit board 1 has components mounted thereon, such as a SAW filter 12, a crystal oscillator 13, and a chip electronic component 14 at predetermined positions. A chip electronic component 14 is basically an RF electronic component, such as a capacitor, a resistor, an inductor, a balun, and a diode.

The resin material 4 is provided on the upper surface side of the circuit board 1 so as to cover the second semiconductor device 11, the SAW filter 12, the crystal oscillator 13, and the chip electronic component 14.

The resin material 4 is composed of resin such as epoxy resin and reinforces the bonding strength among the second semiconductor device 11, the SAW filter 12, the crystal oscillator 13, and the chip electronic component 14.

In the present invention, the resin material 4 does not necessarily have to completely cover the components mounted on the circuit board, namely, the second semiconductor device 11, the SAW filter 12, the crystal oscillator 13, and the chip electronic component 14.

The resin material 4 may at least partially covers these mounted components. For example, referring to FIGS. 4 and 5, in this embodiment, the resin material 4 covers the side surfaces of the second semiconductor device 11 but does not cover the upper surface thereof. The upper surface of the second semiconductor device 11 is directly in contact with a shield resin layer 9, which will be described below.

In this embodiment of the present invention, the resin material 4 also fills the cavity 2 so as to cover the first semiconductor device 10.

Accordingly, the bonding strength of the first semiconductor device 10 to the circuit board 1 can be reinforced.

In addition, because the resin material 4 fills a space 19 between the upper surface of the first semiconductor device 10 and the lower surface of the second semiconductor device 11, the bonding strength of the second semiconductor device 11 can also be reinforced.

Referring to FIG. 6, the second semiconductor device 11 is preferably disposed above the upper surface of the circuit board 1 such that a gap 8 having a predetermined width G is formed between opposing areas of the lower surface of the second semiconductor device 11 and the upper surface of the circuit board 1.

With this gap 8, when resin paste constituting the resin material 4 is to be filled into the cavity 2, the resin paste for covering the first semiconductor device 10 can flow into the cavity through the gap 8 even after the mounting of the second semiconductor device 11 has been completed. Accordingly, in the manufacturing process, the resin material 4 covering both the first and second semiconductor devices 10 and 11 can be formed in a single step.

Here, the width G of the gap 8 between the opposing areas of the lower surface of the second semiconductor device 11 and the upper surface of the circuit board 1 is a distance between the lower surface of the second semiconductor device 11 and the upper surface of the circuit board 1, as illustrated FIGS. 4 and 5.

The width G may be set to, for example, 100 to 200 μm so as to allow a precursor of the resin material 4 to flow.

To provide the gap 8, the following one of or both of the techniques (1) and (2) may be applied.

(1) The connection terminals 6 provided at the lower surface of the second semiconductor device 11 are slightly bent downward.

(2) The electrode pads 5 and/or the conductive bonding material 7 used for the mounting of the second semiconductor device 11 is/are formed relatively thickly.

As illustrated in FIGS. 4 and 5, in this embodiment of the present invention, the upper surface of the resin material 4 has a shield resin member 9 formed thereon. The shield resin member 9 is made of a resin material, such as epoxy resin, having metallic powder of, for example, Ag, Al, Ni, or Fe dispersed therein. The shield resin member 9 covers entirely the upper surface of the resin material 4 and is in direct contact with the upper surface of the second semiconductor device 11 without the resin material 4 interposed therebetween.

Accordingly, with the shield resin member 9 directly covering the upper surface of the second semiconductor device 11, penetration of undesired electromagnetic waves into the second circuit in the second semiconductor device 11 can be suppressed, and moreover, penetration of undesired electromagnetic waves into the circuit provided inside the circuit board 1 can also be suppressed. This allows the electronic component module to operate stably.

In addition, since the shield resin member 9 has high thermal conductivity due to the dispersal of metallic powder, heat generated at the second semiconductor device 11 can be conducted readily from the upper surface of the second semiconductor device 11 to the circuit board 1 or to the atmosphere. This is advantageous in that the second semiconductor device 11 can operate more stably.

An electronic component module according to second embodiment of the present invention will be described below.

Figure 8:
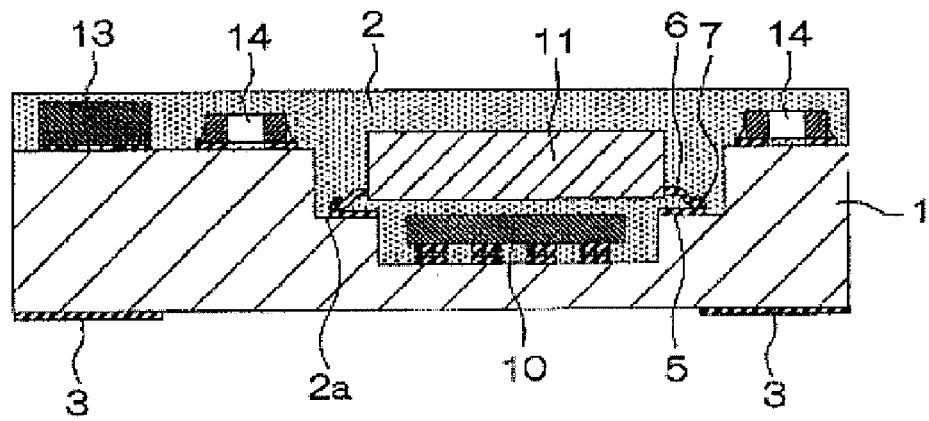
FIG. 8 is a cross-sectional view of an electronic component module according to the second embodiment of the present invention.

FIG. 8 is a cross-sectional view illustrating an electronic component module according to the second embodiment of the present invention.

The electronic component module illustrated in FIG. 8 differs from the electronic component module illustrated in FIGS. 1 to 6 in view of the shape of the cavity 2 and the location of the second semiconductor device 11. Specifically, the cavity 2 has a shoulder section 2a. The electrode pads 5 provided on this shoulder section 2a and the connection terminals 6 provided on the lower surface of the second semiconductor device 11 are electrically and mechanically connected to each other with the conductive bonding material 7.

By providing the cavity 2 with the shoulder section 2a on which the second semiconductor device 11 is disposed, the electronic component module can be made even more compact and have lower profile. In addition, the shoulder section 2a can be advantageously used as a positioning reference during the mounting process of the second semiconductor device 11.

Figure 9:
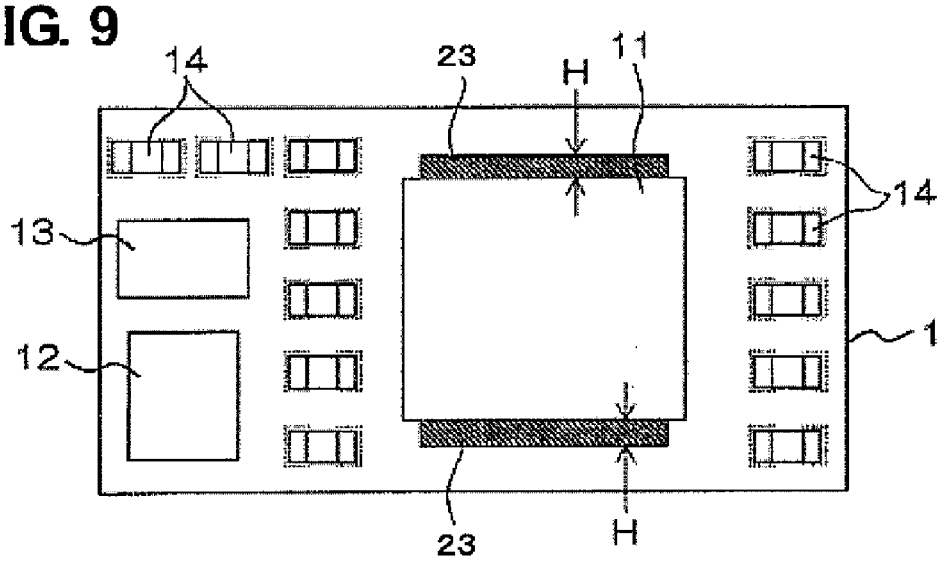
FIG. 9 is a plan view of an electronic component module according to the third embodiment of the present invention, with a resin material omitted therefrom.

FIG. 9 is a top view of an electronic component module according to third embodiment of the present invention.

In the electronic component module illustrated in FIG. 9, at least a part of the opening area of the cavity 2 is located outside of the second semiconductor device 11 in plan view. Thus, the opening area of the cavity has exposed sections 23. Each of the exposed sections 23 may be given a width H of, for example, 100 to 200 μm.

Through these exposed sections 23, the resin material 4 can flow into the cavity 2, whereby the resin material 4 covering both the first and second semiconductor devices can be formed in one step. As illustrated in FIG. 9, it is preferable that two or more exposed sections 23 be provided.

A method for manufacturing the electronic component module according to fourth embodiment of the present invention will now be described with reference to FIGS. 10 to 13.

(Step A)

Figure 10:
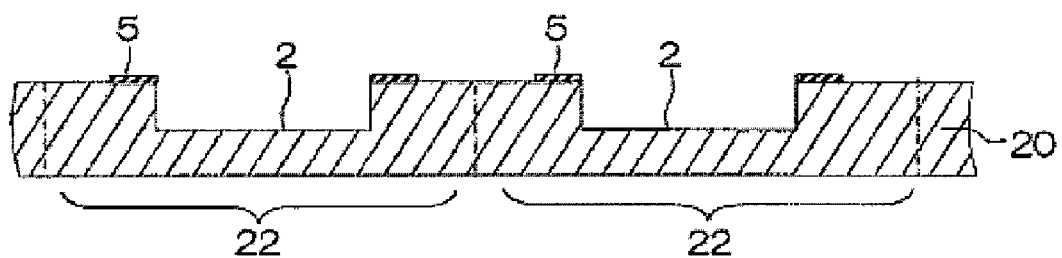
FIG. 10 illustrates a step included in a method for manufacturing the electronic component module according to the fourth embodiment of the present invention.

First, as illustrated in FIG. 10, a master board 20 having a plurality of circuit board areas 22 arranged in a matrix is prepared. Each circuit board area 22 has a cavity 2 in the upper surface thereof.

The master board 20 is formed of multiple layers of green sheets composed of a ceramic material, such as a glass-ceramic material and an alumina ceramic material. In each of the board areas of the master board 20, the upper surface thereof is provided with electrode pads 5 and a surface circuit pattern, the inside thereof is provided with a conductive pattern and a via-hole conductor, and the lower surface thereof is provided with external terminals.

The master board 20 is fabricated in the following manner. For example, ceramic green sheets are first obtained by mixing an appropriate organic solvent with ceramic powder of, for example, an alumina ceramic material. A conductive paste, which is to become electrode pads, external terminals 11, and a conductive bonding material 7, is printed and applied onto a surface of each ceramic green sheet. The ceramic green sheets with the conductive paste thereon are stacked one on top of another and pressed. Subsequently, the ceramic green sheets are fired at high temperature. In this case, by using a commonly known punching technique, for example, through holes are provided in the ceramic green sheets corresponding to the layers where the cavities 2 are to be formed, and a firing step is subsequently performed.

(Step B)

Figure 11:
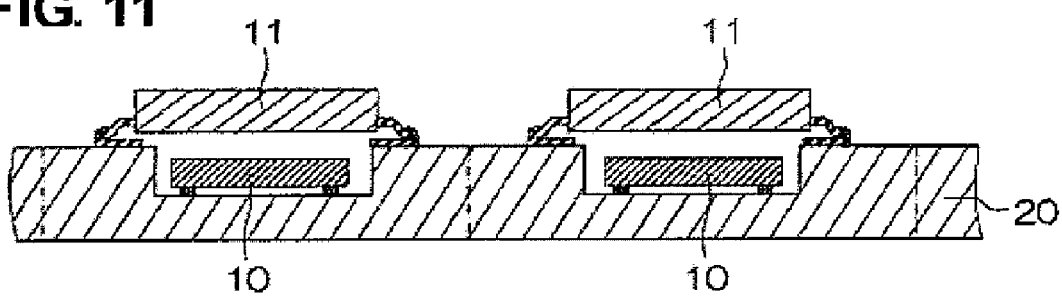
FIG. 11 illustrates another step included in the method for manufacturing the electronic component module according to the fourth embodiment of the present invention.

Subsequently, referring to FIG. 11, first semiconductor devices 10 are placed inside the cavities. Then, second semiconductor devices 11 are mounted onto the corresponding circuit board areas 22 so as to cover the first semiconductor devices 10 and the opening areas of the cavities 2. In this case, a gap 8 (see FIG. 6) having a predetermined width G is formed between the lower surface of each second semiconductor device 11 and the upper surface of the corresponding circuit board area 22. In addition to the second semiconductor device 11, each of the circuit board areas on the upper surface of the master board 20 has chip components disposed thereon, although not shown, such as a SAW filter, a crystal oscillator, and a capacitor at predetermined positions.

(Step C)

Figure 12:
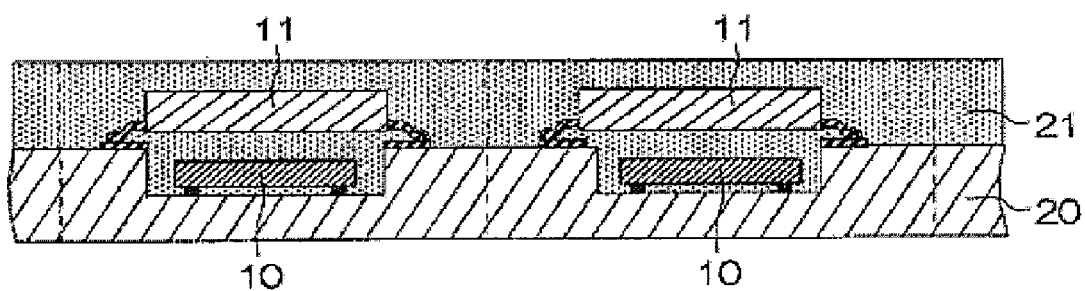
FIG. 12 illustrates another step included in the method for manufacturing the electronic component module according to the fourth embodiment of the present invention.

Subsequently, referring to FIG. 12, a resin paste 21 is applied onto the upper surface of the master board 20. In this case, the resin paste 21 flows into the cavities through the gaps 8. Thus, the resin paste 21 covers the second semiconductor devices 11, and moreover, the resin paste 21 fills the cavities 2. Consequently, the first semiconductor devices 10 and the second semiconductor devices 11 can be almost concurrently covered with the resin paste 21.

When a resin paste is to be applied, a jig for reducing pressure is preferably set so that the resin paste 21 can flow into the cavities 2 (this application technique is called "vacuum printing"). Such a jig may be a type that is disposed only on the upper side or the lower side of the circuit board areas 22 or may be a type that entirely houses the master board 20 onto which the resin paste 21 is to be applied.

If a jig that entirely houses the master board 20 is used to form the resin paste 21 by vacuum printing, the master board is fitted to a frame member in which the master board 20 can be fitted horizontally, and is set on a base. The pressure is reduced until reaching a predetermined degree of vacuum. Subsequently, a precursor of the resin paste 21 is printed and applied onto the one principal surface of the master board 20. In this case, since the master board 20 is entirely housed in the jig that maintains the pressure at the predetermined degree of vacuum, the precursor of the resin paste 21 supplied from the side of the one principal surface flows into the cavities 2 through the gaps 8 or the gaps 19. By allowing the resin paste 21 to cure, the resin paste 21 can cover both the first semiconductor devices 10 and the second semiconductor devices 11 together.

As the resin paste 21, a mixture of thermosetting resin, such as epoxy resin, and a hardener, a hardening accelerator, or other appropriate inorganic fillers where necessary may be used.

When a typical resin paste for sealing electronic components is used, such as a resin paste having a viscosity of about 30 to 80 Pa·s, the gaps 8 and the gaps 19 are preferably given a width of 100 to 200 μm, and the degree of vacuum during printing is preferably set at 80 to 130 Pa. With these set ranges, the resin paste 21 can fill the gaps 8, the gaps 19, and the cavities 2 in a good state with fewer voids.

(Step D)

Figure 13:
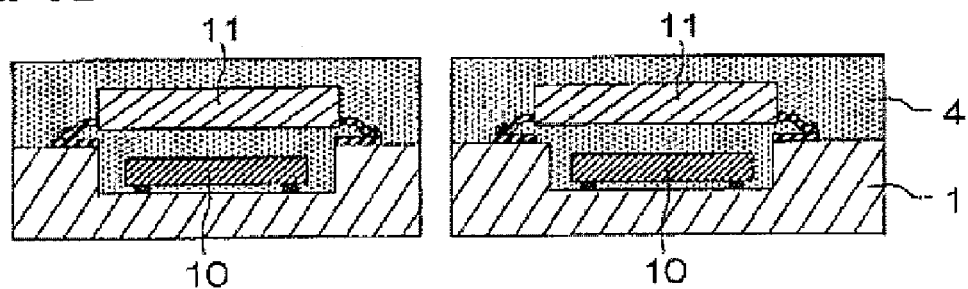
FIG. 13 illustrates another step included in the method for manufacturing the electronic component module according to the fourth embodiment of the present invention.
Figure 14:
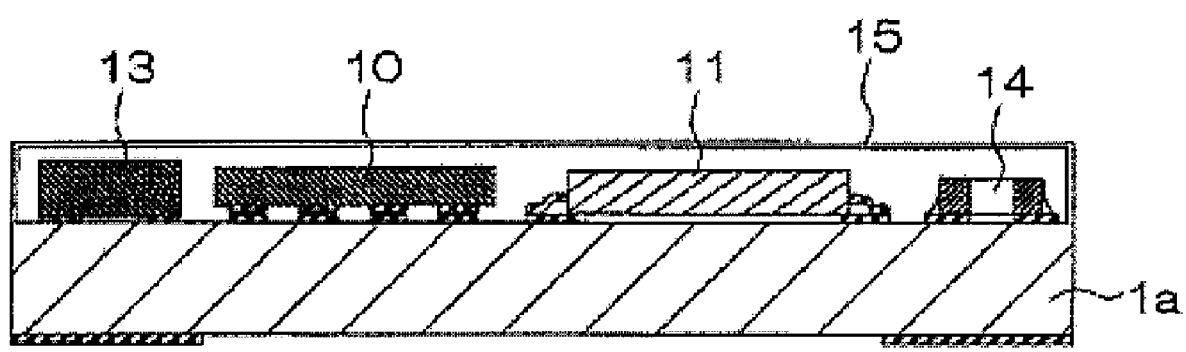
FIG. 14 is a cross-sectional view of an electronic component module of known art.

Referring to FIG. 13, the master board 20 is cut along the circuit board areas 22 so as to be divided into a plurality of separate pieces.

The cutting of the master board 20 and the resin material 4 is performed by, for example, cutting the master board 20 and the resin material 4 almost concurrently from the side of the master board 20 using a dicer, a laser, or the like. Thus, a plurality of electronic component modules can be obtained at once. The cutting direction may be appropriately determined on the basis of the relationships among the cutting means and the materials used for the master board 20 and the resin material 4. Instead of performing the cutting from the side of the master board 20 as mentioned above, the cutting may alternatively be performed from the side of the resin paste 21.

As an alternative to the above-described step B, each of the second semiconductor devices 11 may be set on the upper surface of the corresponding circuit board area 22 so as to overlie the corresponding first semiconductor device 10 and to allow the opening area of the corresponding cavity 2 to be partially exposed in plan view (see FIG. 9). In that case, in the subsequent step C, the resin paste 21 is applied onto the upper surface of the master board 20, and the resin paste 21 is allowed to flow into the cavities through the exposed sections of the opening areas of the cavities. Consequently, the first semiconductor devices 10 and the second semiconductor devices 11 can be almost concurrently covered with the resin paste 21.

According to the above-described manufacturing method, the assembly process of the electronic devices is significantly simplified, thereby allowing for improved productivity of the electronic component modules.

According to the electronic component module, the first semiconductor device is accommodated within the cavity provided in an upper surface of the circuit board, and the second semiconductor device is disposed on the upper surface of the circuit board so as to cover the first semiconductor device. With this configuration, the mount areas of the first and second semiconductor devices on the upper surface of the circuit board can be reduced, whereby the circuit board can be made compact. Accordingly, this allows for size reduction in the entire structure of the electronic component module.

In addition, because the second semiconductor device is covered with the resin material, the assembly process is not complicated as in the case where a shield casing is provided. The resin material can easily protect the second semiconductor device as well as reinforcing the bonding strength of the second semiconductor device.

Furthermore, by covering the first semiconductor device with a resin material, the bonding strength of the first semiconductor device can be reinforced.

In particular, an upper surface of the first semiconductor device and a lower surface of the second semiconductor device may have a space therebetween, and a resin material may fill this space. With this configuration, the bonding strength of the second semiconductor device can be reinforced.

Furthermore, the second semiconductor device may be mounted in a state such that the lower surface of the second semiconductor device and the upper surface of the circuit board have a gap formed therebetween. With this configuration, during the manufacturing process, the resin material can flow into the cavity through the gap between the lower surface of the second semiconductor device and the upper surface of the circuit board even after the mounting of the second semiconductor device has been completed Accordingly, the resin material covering both the first and second semiconductor devices can be formed.

Furthermore, in plan view of the upper surface of the circuit board, the second semiconductor device may partially cover an opening area of the cavity so that a remaining section of the opening area of the cavity is exposed. Thus, the resin material can flow into the cavity through the exposed section of the opening area of the cavity, whereby the resin material covering both the first and second semiconductor devices can be formed.

By providing a plurality of the exposed sections, the resin material can flow into the cavity more readily.

Furthermore, in the electronic component module, the cavity may be provided with a shoulder section, and the second semiconductor device may be disposed above the shoulder section. This allows the electronic component module to have lower profile, whereby the entire structure thereof can be reduced in size.

In a method for manufacturing the electronic component module, the second semiconductor devices are disposed on circuit board areas, each second semiconductor device being disposed so as to cover the corresponding first semiconductor device and the opening area of the corresponding cavity and so as to have a gap to keep a predetermined distance between the lower surface of the second semiconductor device and the upper surface of the corresponding circuit board area. Thus, by subsequently applying a resin paste onto an upper surface of a master board, the resin paste can flow into the cavities through the gaps.

Consequently, a resin material can be applied both onto the upper surfaces of the board areas and into the cavities in the circuit board areas, thereby allowing for improved productivity of the electronic component modules.

In another method for manufacturing the electronic component module, the second semiconductor devices are disposed on upper surfaces of circuit board areas, each second semiconductor device being disposed so as to cover the corresponding first semiconductor device and to expose at least a part of the opening area of the corresponding cavity. Thus, by subsequently applying a resin paste onto an upper surface of a master board, the resin paste can flow into each cavity through an exposed section of the opening area of the cavity. Consequently, a resin material can be applied both onto the upper surfaces of the board areas and into the cavities in the circuit board areas, thereby allowing for improved productivity of the electronic component modules.

The present invention is not limited to the above embodiments, and various changes and modifications are permissible without departing from the scope of the invention.

For example, in the electronic component module according to each of the above embodiments of the present invention, the connection terminals 6 provided at the lower surfaces of the first and second semiconductor devices and the electrode pads 5 provided on the bottom surface of the cavity or on the upper surface of the circuit board 1 are connected to each other with a conductive bonding material. Alternatively, connection terminals provided at the upper surfaces of first and second semiconductor devices may be connected to the electrode pads 5 by wire bonding.

The invention claimed is:
1. An electronic component module comprising:
a circuit board having a cavity in one principal surface thereof;
a first semiconductor device accommodated within the cavity, a second semiconductor device disposed on the one principal surface of the circuit board so as to cover the first semiconductor device in plan view, and a resin material disposed to cover at least a side surface of the second semiconductor device, wherein an upper surface of the resin material is covered with a shield resin member, wherein the shield resin member is adhered to an upper surface of the second semiconductor device.

2. The electronic component module according to claim 1, wherein the resin material fills the cavity and covers the first semiconductor device.

3. The electronic component module according to claim 1, wherein the resin material fills a space between an upper surface of the first semiconductor device and a lower surface of the second semiconductor device.

4. The electronic component module according to claim 2, wherein the second semiconductor device covers an opening area of the cavity in plan view, and wherein a gap is provided between a lower surface of the second semiconductor device and an upper surface of the circuit board, the gap having a predetermined width.

5. The electronic component module according to claim 4, wherein the width of the gap varies in accordance with a thickness and/or a shape of an electrode that connects the second semiconductor device and the circuit board.

6. The electronic component module according to claim 4, wherein the width of the gap varies in accordance with a thickness of a conductive bonding material that connects the second semiconductor device and the circuit board.

7. The electronic component module according to claim 2, wherein the second semiconductor device partially covers an opening area of the cavity.

8. The electronic component module according to claim 7, wherein the opening area of the cavity has a plurality of exposed sections that are not covered by the second semiconductor device.

9. The electronic component module according to claim 1, wherein the cavity has a shoulder section on which the second semiconductor device disposed.

10. The electronic component module according to claim 1, wherein the resin material is formed entirely over the one principal surface of the circuit board.

11. The electronic component module according to claim 10, wherein a side surface of the resin material formed over the one principal surface and a side surface of the circuit board are substantially in flush with each other.

12. The electronic component module according to claim 1, wherein the first semiconductor device comprises an RFIC, and the second semiconductor device comprises a control IC.

13. A method for manufacturing the electronic component module according to claim 1, comprising:

preparing a master board having a plurality of circuit board areas, each circuit board area having a cavity in an upper surface thereof;

placing first semiconductor devices within the cavities;

disposing second semiconductor devices on the circuit board areas, each second semiconductor device being disposed to cover the corresponding first semiconductor device and an opening area of the corresponding cavity and to have a gap to keep a predetermined distance between a lower surface of the second semiconductor device and the upper surface of the corresponding circuit board area;

applying a resin paste onto an upper surface of the master board to cover both the first semiconductor devices and the second semiconductor devices with the resin paste; and cutting the master board along the circuit board areas to divide the master board into a plurality of separate pieces.

14. The method for manufacturing the electronic component module according to claim 13, wherein the width of the gaps varies in accordance with a thickness and/or a shape of electrodes that connect the second semiconductor devices and circuit boards.

15. The method for manufacturing the electronic component module according to claim 13, wherein the width of the gaps varies in accordance with a thickness of a conductive bonding material that connects the second semiconductor devices and circuit boards.

16. The method for manufacturing the electronic component module according to claim 13, wherein the resin paste is applied under reduced pressure.

17. A method for manufacturing the electronic component module according to claim 1, comprising:

preparing a master board having a plurality of circuit board areas, each circuit board area having a cavity in an upper surface thereof;

placing first semiconductor devices within the cavities;

disposing second semiconductor devices on the upper surfaces of the circuit board areas, each second semiconductor device being disposed to cover the corresponding first semiconductor device and to expose at least a part of an opening area of the corresponding cavity;

applying a resin paste onto an upper surface of the master board to cover both the corresponding first semiconductor device and the corresponding second semiconductor device with the resin paste; and cutting the master board along the circuit board areas to divide the master board into a plurality of separate pieces.

18. The method for manufacturing the electronic component module according to claim 17, wherein the opening area of each cavity comprises a plurality of exposed sections.

19. The method for manufacturing the electronic component module according to claim 17, wherein the resin paste is applied under reduced pressure.

20. An electronic component module comprising:

a circuit board having a cavity in one principal surface thereof;

a first semiconductor device accommodated within the cavity, a second semiconductor device which disposes on the one principal surface of the circuit board and covers the first semiconductor device in plan view, and a resin material which covers at least a side surface of the second semiconductor device and contacts directly both an upper surface of the first semiconductor device and a lower surface of the second semiconductor device, wherein the shield resin member is adhered to an upper surface of the second semiconductor device.

21. The electronic component module according to claim 20, wherein the resin material fills the cavity and covers the first semiconductor device.

22. The electronic component module according to claim 20, wherein the resin material fills a space between an upper surface of the first semiconductor device and a lower surface of the second semiconductor device.

23. The electronic component module according to claim 21, wherein the second semiconductor device covers an opening area of the cavity in plan view, and wherein a gap is provided between a lower surface of the second semiconductor device and an upper surface of the circuit board, the gap having a predetermined width.

24. The electronic component module according to claim 23, wherein the width of the gap varies in accordance with a thickness and/or a shape of an electrode that connects the second semiconductor device and the circuit board.

25. The electronic component module according to claim 23, wherein the width of the gap varies in accordance with a thickness of a conductive bonding material that connects the second semiconductor device and the circuit board.

26. The electronic component module according to claim 21, wherein the second semiconductor device partially covers an opening area of the cavity.

27. The electronic component module according to claim 20, wherein the resin material is formed entirely over the one principal surface of the circuit board.

28. The electronic component module according to claim 27, wherein a side surface of the resin material formed over the one principal surface and a side surface of the circuit board are substantially flush with each other.

29. The electronic component module according to claim 20, wherein the first semiconductor device comprises an RFIC, and the second semiconductor device comprises a control IC.

30. The electronic component module according to claim 20, wherein an upper surface of the resin material is covered with a shield resin member.

* * * * *